United States Patent
Sanfilippo et al.

(10) Patent No.: US 7,488,673 B2
(45) Date of Patent: Feb. 10, 2009

(54) TRENCH MOS SCHOTTKY BARRIER RECTIFIER WITH HIGH K GATE DIELECTRIC AND REDUCED MASK PROCESS FOR THE MANUFACTURE THEREOF

(75) Inventors: Carmelo Sanfilippo, Turin (IT); Rossano Carta, Turin (IT); Giovanni Richieri, Turin (IT); Paolo Mercaldi, Turin (IT)

(73) Assignee: International Rectifier Corporation, El Segundo, CA (US)

( * ) Notice: Subject to any disclaimer, the term of this patent is extended or adjusted under 35 U.S.C. 154(b) by 12 days.

(21) Appl. No.: 11/710,110

(22) Filed: Feb. 23, 2007

(65) Prior Publication Data

US 2007/0210347 A1 Sep. 13, 2007

Related U.S. Application Data

(60) Provisional application No. 60/776,780, filed on Feb. 24, 2006.

(51) Int. Cl.
*H01L 21/28* (2006.01)
*H01L 21/44* (2006.01)

(52) U.S. Cl. ........................ 438/570; 438/104; 438/240; 438/700; 257/E21.064; 257/E21.17; 257/E21.173; 257/E21.235; 257/E21.278

(58) Field of Classification Search ................. 438/104, 438/240, 553, 581, 583, 651, 682, 663, 680, 438/700, 570, 721, 722, 723, 743, 755, 756, 438/724, 744, 757
See application file for complete search history.

(56) References Cited

U.S. PATENT DOCUMENTS

| | | | | |
|---|---|---|---|---|
| 5,365,102 A | * | 11/1994 | Mehrotra et al. | 257/475 |
| 5,489,548 A | * | 2/1996 | Nishioka et al. | 438/396 |
| 5,612,567 A | * | 3/1997 | Baliga | 257/475 |
| 6,855,593 B2 | * | 2/2005 | Andoh et al. | 438/237 |
| 7,323,402 B2 | * | 1/2008 | Chiola | 438/576 |

* cited by examiner

*Primary Examiner*—David Nhu
(74) *Attorney, Agent, or Firm*—Ostrolenk, Faber, Gerb & Soffen, LLP

(57) ABSTRACT

A trench MOS Schottky barrier device has a metal oxide gate dielectric such as TiSi lining the trench wall to increase the efficiency of the elemental cell and to improve depletion in the mesa during reverse bias. A reduced mask process is used in which a single layer of titanium or other metal is deposited on an underlying gate oxide layer on the trench walls and directly atop the mesa between adjacent trenches. A common thermal treatment causes the Ti to diffuse into the $SiO_2$ gate oxide to form the $TiO_2$ gate and to form the TiSi Schottky barrier on the top surface of the mesa.

5 Claims, 1 Drawing Sheet

TRENCH MOS SCHOTTKY BARRIER RECTIFIER WITH HIGH K GATE DIELECTRIC AND REDUCED MASK PROCESS FOR THE MANUFACTURE THEREOF

RELATED APPLICATIONS

This application claims the benefit of U.S. Provisional Application No. 60/776,780, filed Feb. 24, 2006, the entire disclosure of which is incorporated by reference herein.

FIELD OF THE INVENTION

This invention relates to semiconductor devices, particularly to a novel trench MOS Schottky barrier rectifier and a novel reduced mask process for the manufacture thereof.

BACKGROUND OF THE INVENTION

Trench type Schottky rectifiers are well known. In these devices, a trench structure is first formed in a silicon body and a deposited or thermally grown oxide is formed to line the trench walls. The trenches are then filled with conductive polysilicon or other conductive material. A Schottky barrier metal is then deposited on the tops of the device mesas between trenches. The overall efficiency of the elemental cell is generally defined by the dielectric constant k of the silicon dioxide gate, among other factors. Further, the process requires plural mask steps for the formation of the device. (It is generally not a self-aligned process.)

BRIEF DESCRIPTION OF THE INVENTION

In accordance with the present invention, a high k dielectric, for example titanium oxide or another high k metal oxide, is used for the gate dielectric. The use of the high k gate dielectric improves the overall efficiency of the elementary cell. That is, the high k gate permits improved depletion in the mesa during reverse bias.

Further, in accordance with the invention, titanium or another metal is deposited atop a silicon oxide layer on the trench walls and, simultaneously, atop the mesas of the trenched wafer or die. This eliminates a mask step and defines a two mask process. A thermal treatment is then carried out, with the metal (for example, titanium, diffusing into the gate silicon dioxide to convert the silicon dioxide to a high k metal oxide (such as titanium dioxide) and, at the same time, forming a silicide Schottky barrier on the device mesas.

After the annealing process which forms the silicide-to-Schottky interface and the conversion of the gate oxide to a high k metal dielectric, top and bottom metal contacts are applied to the top and bottom device surfaces.

BRIEF DESCRIPTION OF THE PREFERRED EMBODIMENTS

Figure 1:
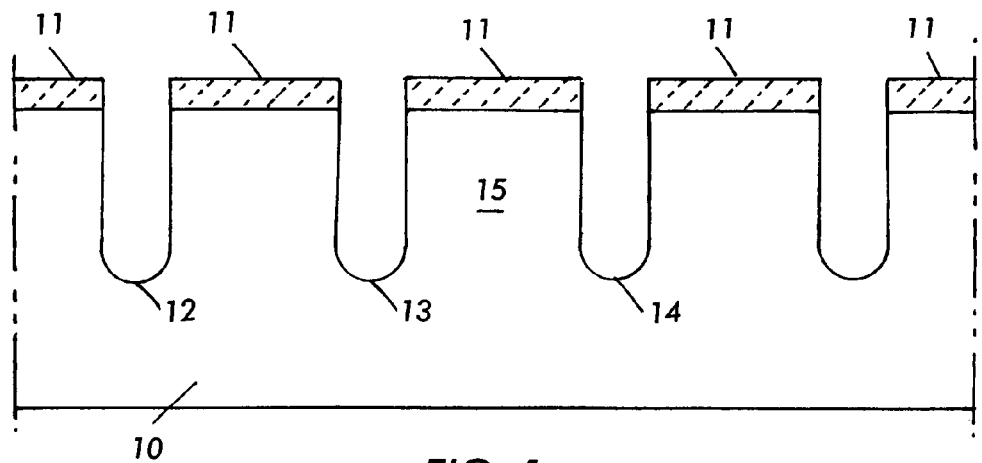
FIG. 1 is a cross-section of a small portion of a Schottky wafer or die after the formation of trenches therein.

FIG. 1 shows a silicon wafer (or die) 10 which receives a hard mask such as a layer of silicon nitride 11 which is photolithographically processed to define a trench mask, and the subsequent etch, which may be a dry silicon etch to form trench regions 12, 13, 14, 15 etc.

Figure 2:
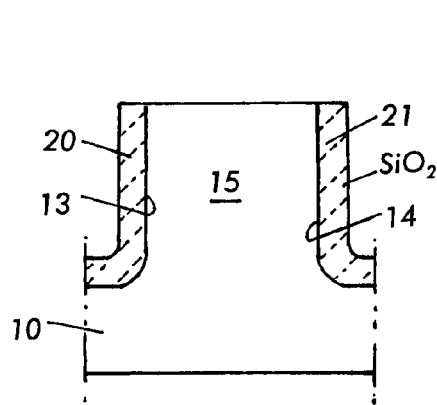
FIG. 2 shows one of the elemental cells of FIG. 1 after the formation of a silicon dioxide layer on the trench walls.

Thereafter and as shown in FIG. 2, in which trenches 13 and 14 of FIG. 1 define the mesa 15, a gate insulator, preferably silicon dioxide, is deposited or thermally grown to form oxide layers 20 and 21 in trenches 13 and 14 respectively and on their side walls and bottoms of any desired thickness.

The hard mask 11 is then removed and the wafer is cleaned for a Schottky barrier deposition. A suitable metal, such as titanium is then applied to the top surface of the device, as by a suitable vapor deposition process, over both the mesas of the device and the oxide layers in the trenches.

Thereafter, a thermal treatment or anneal process is carried out so that the barrier metal on the mesas diffuse into the silicon to form a silicide Schottky barrier (FIG. 3), and, simultaneously, the metal diffuses into the gate oxide layers 20 and 21 to convert these layers to a metal oxide 30, 31 respectively of a higher dielectric constant k, than that of the oxide layers 20, 21.

Figure 3:
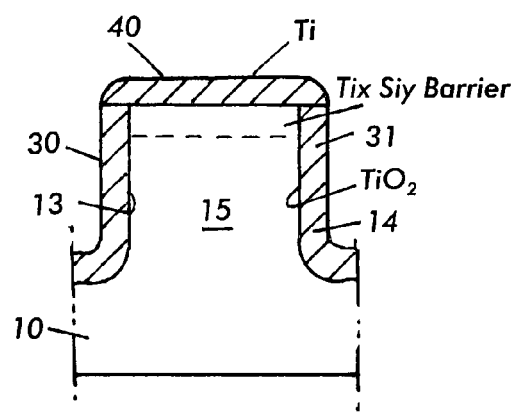
FIG. 3 shows the cell of FIG. 2 after the deposition of a silicide-forming metal, for example, titanium, thereon and the annealing heat treatment thereof.
Figure 4:
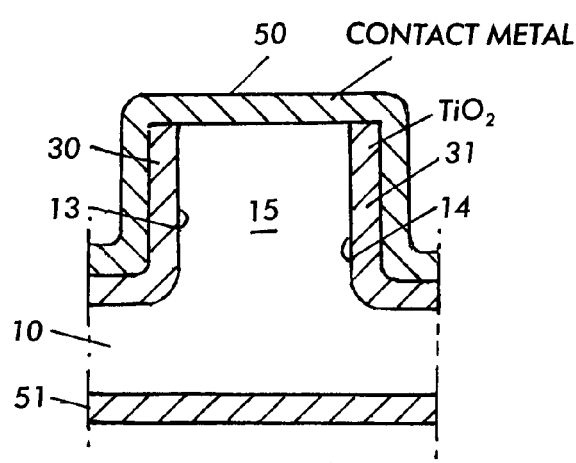
FIG. 4 shows the cell of FIG. 3 after the deposition of contact metals on the top and bottom surfaces of the devices.

When titanium is used as the deposited metal 40 in FIG. 3 the metal dielectric 30, 31 is formed by the reaction:

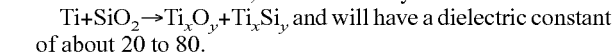

and will have a dielectric constant of about 20 to 80.

Thereafter, and as shown in FIG. 3, excess Ti metal can be removed and top and bottom metals 50 and 51 respectively are applied to the device.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A trench type Schottky barrier device having a high dielectric layer lining trenches of said trench type Schottky barrier device, wherein dielectric constant of said high dielectric layer is greater than that of silicon dioxide.

2. The trench type Schottky barrier device of claim 1, wherein said high dielectric is a metal oxide.

3. The trench type Schottky barrier device of claim 2, wherein said metal oxide is a titanium oxide.

4. A reduced mask process for the manufacture of a trench type Schottky barrier type device wherein a silicide forming metal is applied both to device mesas and to a gate oxide lining an interior of device trenches and a subsequent thermal treatment step simultaneously convert said metal to a silicide Schottky barrier on the device mesas of the trench type Schottky barrier type device and to convert the gate oxide to a high dielectric metal oxide.

5. A process for forming a high dielectric oxide layer on walls of a trench in a silicon wafer, comprising: forming a silicon dioxide layer on said walls; applying a metal over said silicon dioxide layer; and thermally treating silicon dioxide layer to cause said metal to diffuse into said silicon dioxide to form a metal oxide of increased dielectric constant of said high dielectric oxide layer as compared to that of silicon dioxide.

* * * * *